(12) United States Patent
Moon (10) Patent No.: US 12,224,026 B2
(45) Date of Patent: Feb. 11, 2025

(54) SEMICONDUCTOR MEMORY DEVICE AND MEMORY SYSTEM PERFORMING ERROR CORRECTION OPERATION

(71) Applicant: SK hynix Inc., Gyeonggi-do (KR)

(72) Inventor: Hong Ki Moon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 164 days.

(21) Appl. No.: 18/101,123

(22) Filed: Jan. 25, 2023

(65) Prior Publication Data

US 2024/0161853 A1    May 16, 2024

(30) Foreign Application Priority Data

Nov. 10, 2022   (KR) ........................ 10-2022-0149835

(51) Int. Cl.
*G11C 29/00*    (2006.01)
*G11C 29/18*    (2006.01)
*G11C 29/42*    (2006.01)
*G11C 29/46*    (2006.01)

(52) U.S. Cl.
CPC .............. *G11C 29/42* (2013.01); *G11C 29/18* (2013.01); *G11C 29/46* (2013.01)

(58) Field of Classification Search
CPC ............. G06F 11/1068; G06F 11/1048; G06F 11/004; G06F 11/073; G06F 11/076; G06F 11/0772; G06F 11/3037; G06F 2201/81; G06F 3/0619; G06F 3/064; G06F 3/0679; G06F 11/1016; G06F 11/102; G11C 29/52; G11C 2029/0409; G11C 2029/0411; G11C 29/42; G11C 29/70; G11C 29/18; G11C 29/46; G11C 7/1051

See application file for complete search history.

(56) References Cited

U.S. PATENT DOCUMENTS 10,705,908 B2 *  7/2020  Chung .................. G06F 3/0679
2004/0243886 A1  12/2004  Klein
2020/0210278 A1   7/2020  Rooney et al.

FOREIGN PATENT DOCUMENTS

KR    10-2020-0028255 A    3/2020

* cited by examiner

*Primary Examiner* — Thong Q Le
(74) *Attorney, Agent, or Firm* — IP & T GROUP LLP (57) ABSTRACT

A semiconductor memory device includes a command address control circuit configured to generate an error correction command and selection address for executing an error correction operation by receiving an external control signal, an error flag generation circuit configured to correct an error of data corresponding to the selection address and configured to generate a target error flag based on a pattern of the error of the data, and an error information processing circuit configured to generate a target address that is used as the selection address based on the target error flag in a target error correction operation that is executed based on the error correction operation.

27 Claims, 6 Drawing Sheets

SEMICONDUCTOR MEMORY DEVICE AND MEMORY SYSTEM PERFORMING ERROR CORRECTION OPERATION

CROSS-REFERENCE TO RELATED APPLICATION

The present application claims priority under 35 U.S.C. § 119(a) to Korean application number 10-2022-0149835, filed on Nov. 10, 2022, the entire disclosure of which is incorporated herein by reference.

BACKGROUND

Various embodiments of the present disclosure relate to a semiconductor memory device and a memory system and, more particularly, to a semiconductor memory device and a memory system, which execute an error correction operation.

Semiconductor memory devices may be divided into nonvolatile memory devices, such as a NAND flash, and volatile memory devices such as DRAM (Dynamic Random Access Memory). A finer process is applied to the semiconductor memory device in order to increase the storage capacity of a semiconductor memory device. It is expected that a bit error ratio of the semiconductor memory device will be increased as the process scale is reduced. Accordingly, several methods have been introduced into the semiconductor memory device in order to improve the reliability of data. As one of the methods, an error correction operation of checking the number of bits of an error of data stored in a memory cell and identifying a location of a memory cell in which an error has occurred by using an error correction code (ECC) for detecting and correcting the error of the data and re-storing data, an error bit of which has been corrected, may be executed.

SUMMARY

In an embodiment, a semiconductor memory device may include a command address control circuit configured to generate an error correction command and selection address for executing an error correction operation by receiving an external control signal, an error flag generation circuit configured to correct an error of data corresponding to the selection address and configured to generate a target error flag based on a pattern of the error of the data, and an error information processing circuit configured to generate a target address that is used as the selection address based on the target error flag in a target error correction operation that is executed based on the error correction operation.

Furthermore, in an embodiment, a memory system may include a semiconductor memory device and a memory controller configured to control the semiconductor memory device. The semiconductor memory device may generate a selection address so that an error correction operation for a counting address or a target error correction operation for a target address is selectively executed in response to a control signal that is provided by the memory controller, and may generate the target address when an error corrected in the error correction operation is a target error having a predetermined pattern.

In an embodiment, a method of executing an error correction operation may include transmitting a control signal from a memory controller to a semiconductor memory device in order to execute an error correction operation, selecting, as a target address, an address in which a corrected error has occurred when the error corrected while an error correction operation is executed in the semiconductor memory device has a predetermined pattern, and executing a target error correction operation on the target address after the error correction operation is performed in the semiconductor memory device by a predetermined number.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

A "logic bit set" may mean a combination of logic levels of bits included in a signal. When a logic level of each of the bits included in the signal is changed, a logic bit set of the signal may be differently set. For example, if two bits are included in a signal, a logic bit set of the signal may be set as a first logic bit set when logic levels of the two bits included in the signal are a "logic low level" and a "logic low level", and may be set as a second logic bit set when logic levels of the two bits included in the signal are a "logic low level", and a "logic high level".

Hereafter, the present disclosure will be described in more detail through embodiments. The embodiments are only used to exemplify the present disclosure, and the scope of the present disclosure is not limited by the embodiments.

Figure 1:
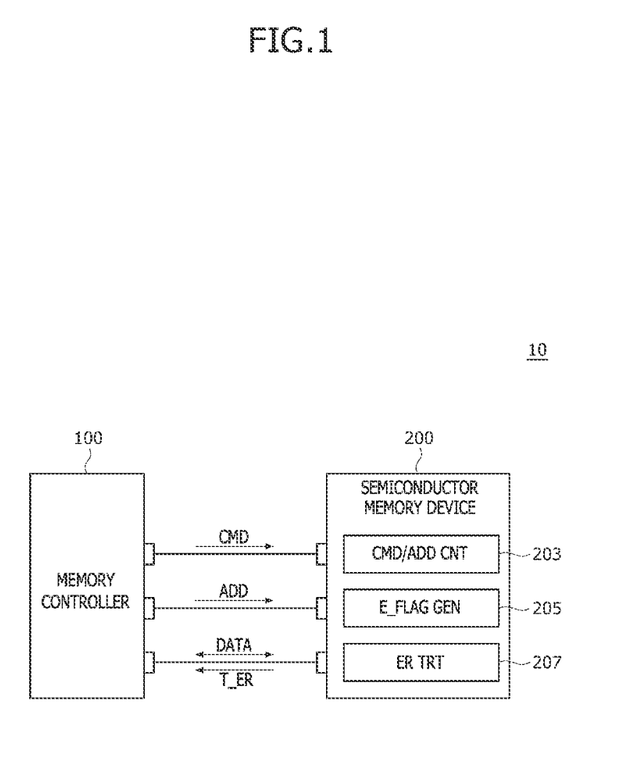
FIG. 1 is a block diagram illustrating a construction of a memory system according to an embodiment of the present disclosure.

FIG. 1 is a block diagram illustrating a construction of a memory system 10 according to an embodiment of the present disclosure. As illustrated in FIG. 1, the memory system 10 may include a memory controller 100 and a semiconductor memory device 200. The semiconductor memory device 200 has been illustrated as being implemented as one block, but may be implemented as multiple semiconductor memory devices according to an embodiment. The memory controller 100 may generate a command CMD and an address ADD so that the semiconductor memory device 200 executes a write operation, a read operation, a refresh operation, and an error correction operation. The semiconductor memory device 200 may execute a write operation, a read operation, a refresh operation, and an error correction operation by receiving the command CMD and the address ADD from the memory controller 100.

The semiconductor memory device 200 may execute a write operation of receiving data DATA from the memory controller 100 and storing the data DATA in a data storage circuit (2027 in FIG. 2), based on the command CMD and the address ADD for executing the write operation. The semiconductor memory device 200 may execute a read operation of outputting, to the memory controller 100, data DATA stored in the data storage circuit, based on the command CMD and the address ADD for executing the read operation. The semiconductor memory device 200 may execute a refresh operation of detecting and amplifying data DATA stored in the data storage circuit and re-storing the data in the data storage circuit, based on the command CMD and the address ADD for executing the refresh operation. The semiconductor memory device 200 may execute an error correction operation of checking an error included in data DATA stored in the data storage circuit, correcting the error, and re-storing the data the error of which has been corrected in the data storage circuit, based on the command CMD and the address ADD for executing an error correction operation from the memory controller 100. The semiconductor memory device 200 may include a command address control circuit (CMD/ADD CNT) 203, an error flag generation circuit (E_FLAG GEN) 205, and an error information processing circuit (ER TRT) 207.

The command address control circuit 203 may generate an internal command and an internal address for an operation of the semiconductor memory device 200. In an error correction operation, the command address control circuit 203 may generate a selection address (S_ADD in FIG. 2) for executing the error correction operation. A location at which the error correction operation is executed may be determined based on the selection address. Furthermore, the command address control circuit 203 may count the number of error correction operations executed. The selection address may be changed based on the number of error correction operations executed.

The error flag generation circuit 205 may execute an error correction operation based on a location according to the selection address. The error flag generation circuit 205 may identify a pattern of an error that has occurred in data while executing the error correction operation. The error flag generation circuit 205 may generate an error flag (E_FLAG in FIG. 2) or a target error flag (TE_FLAG in FIG. 2) based on the pattern of the error of the data. The target error flag may be generated when the pattern of the error of the data is identical with a predetermined pattern. The predetermined pattern may correspond to a case in which an error has occurred in data that is stored in memory cells which may cause a problem in an operation of the semiconductor memory device 200, that is, which are determined to have insufficient reliability, even after the error has been corrected.

The error information processing circuit 207 may store error information in response to the error flag or target error flag that is generated while an error correction operation is executed. The error information processing circuit 207 may store an address ADD at a location at which a corrected error will occur, in response to the target error flag. The error information that is stored in response to the target error flag may be used as a selection address of a target error correction operation that is executed when the number of error correction operations executed reaches a predetermined number.

The semiconductor memory device 200 can improve the reliability of memory cells in which data in which an error having a predetermined pattern has occurred has been stored, by providing a target error correction operation of repeatedly performing an error correction operation on data stored in memory cells that are determined to have insufficient reliability through the error correction operation.

Figure 2:
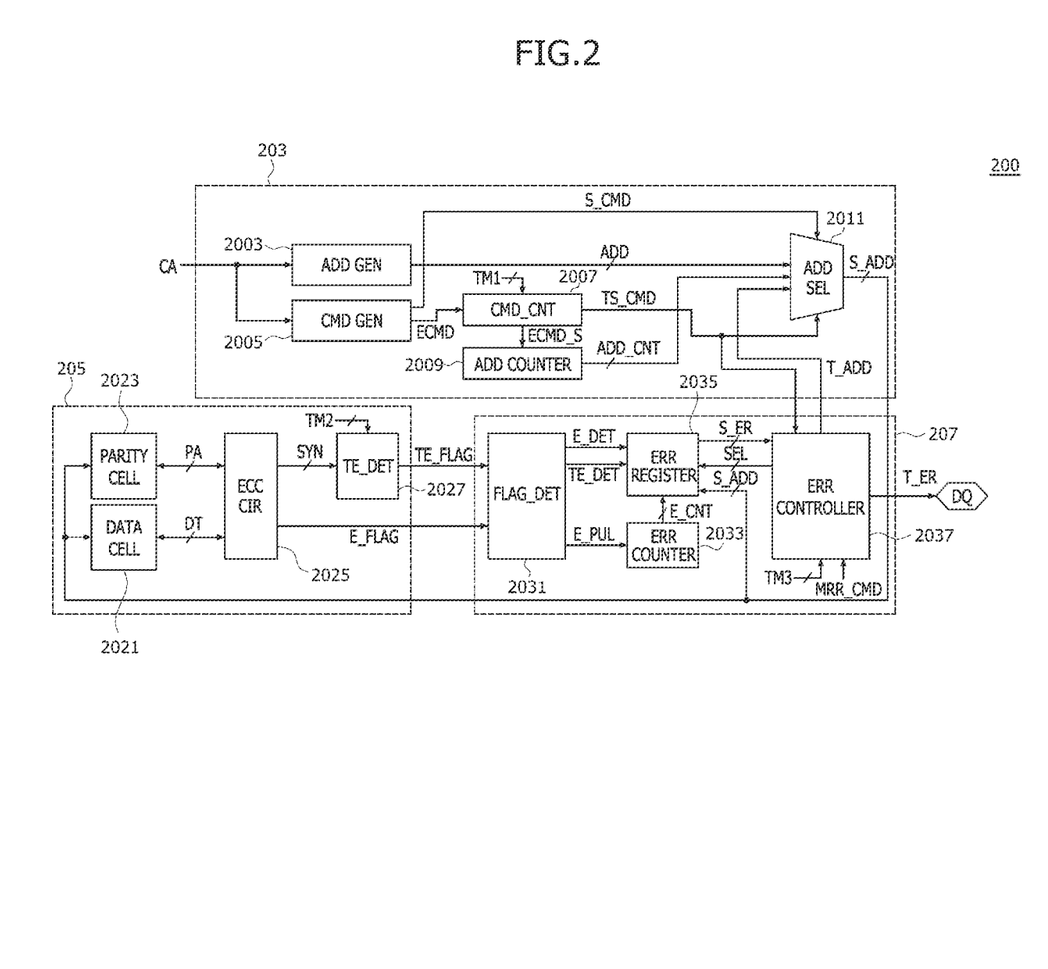
FIG. 2 is a block diagram illustrating a construction of a semiconductor memory device according to an embodiment of the present disclosure.

FIG. 2 is a block diagram illustrating a construction of the semiconductor memory device 200 according to an embodiment of the present disclosure. Circuits not related to the present disclosure are omitted for the understanding of the present disclosure. As illustrated in FIG. 2, the semiconductor memory device 200 may include the command address control circuit 203, the error flag generation circuit 205, and the error information processing circuit 207.

The command address control circuit 203 may include an internal address generation circuit (ADD GEN) 2003, a command generation circuit (CMD GEN) 2005, a command control circuit (CMD CNT) 2007, an address counter (ADD COUNTER) 2009, and an address selection circuit (ADD SEL) 2011. The command address control circuit 203 may receive an external control signal CA for executing an error correction operation from the memory controller 100 in FIG. 1. The command generation circuit 2005 may generate an error correction command ECMD and selection command S_CMD for executing the error correction operation in response to the external control signal CA. The error correction command ECMD may be input to the command control circuit 2007. The command control circuit 2007 may count the number of error correction commands ECMD that have been input. The command control circuit 2007 may generate a selection error correction command ECMD_S and a target selection command TS_CMD in response to the error correction command ECMD. The target selection command TS_CMD may be generated when the number of error correction commands ECMD that has been input reaches a predetermined number. The predetermined number may be adjusted based on a first test mode signal TM1. The first test mode signal TM1 may be generated based on at least one of an internal temperature, a data usage, an error occurrence ratio, or a set signal stored in a mode register. The target selection command TS_CMD may be repeatedly generated whenever the number of error correction command ECMD that has been input reaches the predetermined number. The selection error correction command ECMD_S may be provided to the address counter 2009. The address counter 2009 may output, as a counting address ADD_CNT, address information that is sequentially increased based on the selection error correction command ECMD_S. The address selection circuit 2011 may generate the counting address ADD_CNT as a selection address S_ADD in response to the selection command S_CMD that is input from the command generation circuit 2005, and may provide the selection address S_ADD to the error flag generation circuit 205.

The error flag generation circuit 205 may include a data storage circuit (DATA CELL) 2021, a parity storage circuit (PARITY CELL) 2023, an error correction circuit (ECC CIR) 2025, and a target error detection circuit (TE_DET) 2027. The error flag generation circuit 205 may check an error of data DT stored in the data storage circuit 2021 and correct the error, based on the selection address S_ADD. The data storage circuit 2021 and the parity storage circuit 2023 may output the data DT and a parity PA based on the selection address S_ADD. The error correction circuit 2025 may generate a syndrome SYN based on the data DT and the parity PA, may check whether an error of the data DT has occurred by decoding the syndrome SYN, and may generate the error flag E_FLAG if the error of the data DT has occurred (e.g., when a bit not including 0, among bits included in the syndrome SYN, occurs). In this case, a method of generating the syndrome SYN and a method of checking whether an error of the data DT has occurred by decoding the syndrome SYN may be performed by an error correction code that is implemented as known H-MATRIX. The error correction circuit 2025 may correct an error if the error has occurred in the data DT, and may re-store the data DT, the error of which has been corrected, in the data storage circuit 2021. Furthermore, the syndrome SYN that is generated by the error correction circuit 2025 may be input to the target error detection circuit 2027. The target error detection circuit 2027 may identify whether a pattern of an error occurred in the data DT is a predetermined pattern that has been set by a second test mode signal TM2, when it is checked that the error has occurred in the data DT based on the syndrome SYN. The pattern of the error may include information with regard to a location at which the error of the data DT has occurred. The target error detection circuit 2027 may adjust the predetermined pattern in response to the second test mode signal TM2. The target error detection circuit 2027 may generate the target error flag TE_FLAG when the pattern of the error occurred in the data DT, which has been identified based on the syndrome SYN, is identical with the predetermined pattern. An operation and construction of the target error detection circuit 2027 are subsequently described in detail.

The error information processing circuit 207 may include a flag detection circuit (FLAG_DET) 2031, an error counter (ERR COUNTER) 2033, an error information storage circuit (ERR REGISTER) 2035, and an error information input and output (I/O) control circuit (ERR CONTROLLER) 2037. The error information processing circuit 207 may store and output error information based on the error flag E_FLAG and the target error flag TE_FLAG. The flag detection circuit 2031 may generate an error detection signal E_DET, a target error detection signal TE_DET, and an error pulse E_PUL based on the error flag E_FLAG and the target error flag TE_FLAG. The flag detection circuit 2031 may generate the error detection signal E_DET when the error flag E_FLAG occurs. The flag detection circuit 2031 may generate the target error detection signal TE_DET when the target error flag TE_FLAG occurs. Furthermore, the flag detection circuit 2031 may generate the error pulse E_PUL when the error flag E_FLAG or the target error flag TE_FLAG occurs. The error counter 2033 may generate an error counting signal E_CNT by receiving the error pulse E_PUL. The error counter 2033 may generate the error counting signal E_CNT by counting the error pulse E_PUL. Accordingly, the error counting signal E_CNT may include information with regard to the number of error correction operations and the number of target error correction operations that have been executed. The error information storage circuit 2035 may store error information in response to the error detection signal E_DET, the target error detection signal TE_DET, the error counting signal E_CNT, and the counting address ADD_CNT. The error information storage circuit 2035 may store, as the error information, information with regard to a location at which an error has occurred based on the selection address S_ADD when the error detection signal E_DET is generated according to an error correction operation, and may store, as the error information, the number of errors that have occurred in response to the error counting signal E_CNT. Furthermore, the error information storage circuit 2035 may store, as the error information, information with regard to a location at which an error has occurred based on the selection address S_ADD when the target error detection signal TE_DET is generated according to a target error correction operation, and may store, as the error information, the number of errors that have occurred in response to the error counting signal E_CNT. The error information storage circuit 2035 may output, as selection error information S_ER, information that is included in the error information and that is selected by the information selection signal SEL. The error information I/O control circuit 2037 may receive, as the selection error information S_ER, error information that has been stored in the error information storage circuit 2035 in response to an information selection signal SEL. Information that is included in the error information stored in the error information storage circuit 2035 and that is selected by the information selection signal SEL as the selection error information S_ER may be implemented entirely or partially in some embodiments. The error information I/O control circuit 2037 may generate the information selection signal SEL in response to at least one of the target selection command TS_CMD and a third test mode signal TM3. The error information I/O control circuit 2037 may apply a target address T_ADD to the address selection circuit 2011 when the target selection command TS_CMD is generated. The error information I/O control circuit 2037 may extract the target address T_ADD from the selection error information S_ER or receive the target address T_ADD from a data pin DQ, in response to the third test mode signal TM3. Furthermore, the error information I/O control circuit 2037 may output some or all of pieces of error information stored in the error information storage circuit 2035 through the data pin DQ in order to apply the error information to the memory controller 100 in response to the mode register read command MRR_CMD.

The command control circuit 2007 may count the error correction command ECMD. When the number of error correction commands ECMD reaches a predetermined number "N" (N is a natural number equal to or greater than 2), the command control circuit 2007 may execute a target error correction operation. When the number of error correction commands ECMD reaches a predetermined number, the command control circuit 2007 may generate the target selection command TS_CMD, and may output the target address T_ADD as the selection address S_ADD. Specifically, the address selection circuit 2011 may output the target address T_ADD as the selection address S_ADD in response to the target selection command TS_CMD, so that a target error correction operation, that is, an error correction operation for the target address T_ADD, may be executed. The error information I/O control circuit 2037 may request the error information storage circuit 2035 as the information selection signal SEL in response to the target selection command TS_CMD, receive the selection error information S_ER, and generate the target address T_ADD based on the selection error information S_ER. According to an embodiment, the error information I/O control circuit 2037 may receive the selection error information S_ER by previously requesting the selection error information S_ER before the target selection command TS_CMD is input. The target addresses T_ADD that are generated based on the selection error information S_ER may correspond to data in which an error having a predetermined pattern has occurred in a previous error correction operation. Accordingly, the reliability of memory cells in which the data has been stored may be determined to be relatively low. In another embodiment, the target addresses T_ADD may include an address in which an error has occurred in a read/write operation in addition to a previous error correction operation. According to another embodiment, the target addresses T_ADD may also include an address adjacent to an address in which an error has occurred, in addition to the address in which the error has occurred. Accordingly, the reliability of memory cells in which data has been stored can be improved by repeatedly performing a target error correction operation on the target addresses T_ADD that is generated based on the selection error information S_ER. The output order of the target addresses T_ADD may be changed. The error information I/O control circuit 2037 may sequentially output the target addresses T_ADD that are generated based on the selection error information S_ER. The error information I/O control circuit 2037 may sequentially output the target addresses T_ADD in order of the selection error information S_ER received. The error information I/O control circuit 2037 may sequentially output the target addresses T_ADD based on the number of errors occurred, which is included in the selection error information S_ER. According to an embodiment, the error information I/O control circuit 2037 may directly receive an address and generate the address as the target address T_ADD, in response to the third test mode signal TM3. In this case, the address may be received through the data pin DQ. The error information I/O control circuit 2037 may provide the memory controller 100 with transmission error information T_ER. The error information I/O control circuit 2037 may directly transmit the transmission error information T_ER to the memory controller 100 through the data pin DQ in response to a mode register read command MRR_CMD. In some embodiments, the transmission error information T_ER may be implemented identically with the selection error information S_ER or may be implemented as some of the selection error information S_ER.

Figure 3:
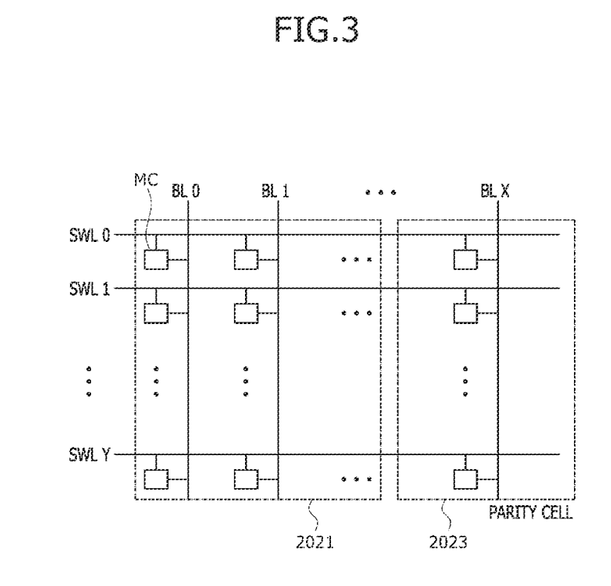
FIG. 3 is a block diagram illustrating a construction of a data storage circuit and a parity storage circuit according to an embodiment of the present disclosure.

FIG. 3 is a block diagram illustrating a construction of a storage circuit (a semiconductor cell) of the semiconductor memory device according to an embodiment of the present disclosure. As illustrated in FIG. 3, the storage circuit may include a data storage circuit 2021 and a parity storage circuit 2023. Each of the data storage circuit 2021 and the parity storage circuit 2023 may include multiple memory cells MC that are connected to multiple sub-word lines SWL0 and SWL1 to SWLY and multiple bit lines BL0 and BL1 to BLX, respectively. At least one of the multiple sub-word lines SWL0 and SWL1 to SWLY and at least one of the multiple bit lines BL0 and BL1 to BLX may be selected by the selection address S_ADD. The data storage circuit 2021 may output the data DT stored in memory cells MC that are connected to the at least one sub-word line and at least one bit line selected based on the selection address S_ADD. The parity storage circuit 2023 may output the parity PA stored in memory cells MC that are connected to the at least one sub-word line and at least one bit line selected based on the selection address S_ADD. The data storage circuit 2021 and the parity storage circuit 2023 may share the multiple sub-word lines SWL0 and SWL1 to SWLY. When an error of the data DT output by memory cells MC adjacent to the parity storage circuit 2023, among the memory cells MC included in the data storage circuit 2021, occurs, there may be a good possibility that an error of the parity PA output by memory cells MC included in the parity storage circuit 2023 may occur. Accordingly, the reliability of memory cells can be improved by designating, as a target error pattern on which a target error correction operation needs to be executed, the time when an error of the data DT output by the memory cells MC adjacent to the parity storage circuit 2023, among the memory cells MC in the data storage circuit 2021, occurs in an error correction operation and performing the target error correction operation on the memory cells MC in which the target error pattern has occurred, during the error correction operation.

Figure 4:
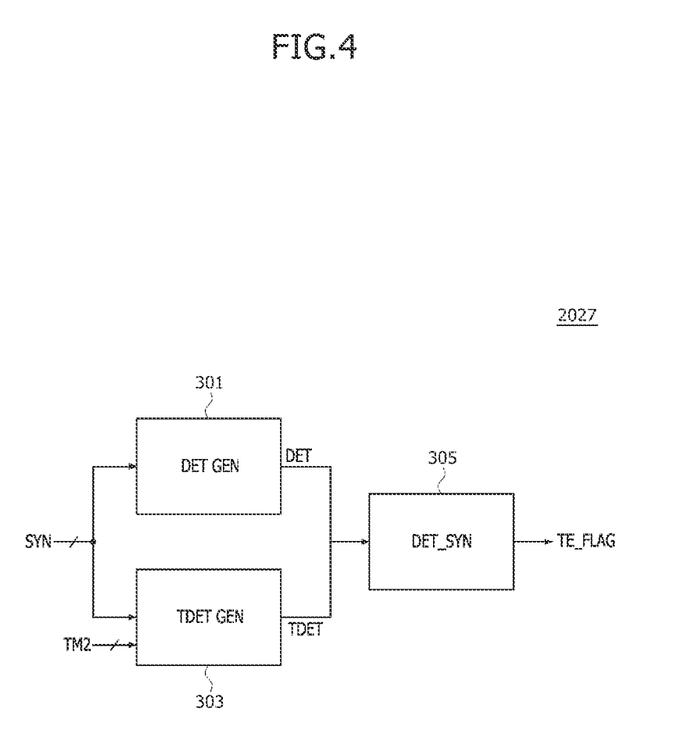
FIG. 4 is a block diagram illustrating a construction of a target error detection circuit according to an embodiment of the present disclosure.

FIG. 4 is a block diagram illustrating a construction of the target error detection circuit 2027 according to an embodiment of the present disclosure. As illustrated in FIG. 4, the target error detection circuit 2027 may include a target error sensing circuit (DET_GEN) 301, a test target error sensing circuit (TDET_GEN) 303, and a sensing signal synthesis circuit (DET_SYN) 305. The target error sensing circuit 301 may generate a detection signal DET when an error corresponding to a target error pattern occurs based on the syndrome SYN. The target error sensing circuit 301 may decode the syndrome SYN, and may generate the detection signal DET when an error of the data DT output by memory cells MC adjacent to the parity storage circuit 2023, among the memory cells MC included in the data storage circuit 2021, occurs in an error correction operation, that is, when an error corresponding to a target error pattern occurs. The test target error sensing circuit 303 may generate the detection signal DET when an error corresponding to a test target error pattern occurs, based on the syndrome SYN and the second test mode signal TM2. The test target error sensing circuit 303 may generate the test detection signal DET when an error corresponding to a test target error pattern that has been set by the second test mode signal TM2 occurs, by decoding the syndrome SYN. Memory cells MC at various locations, among the memory cells MC included in the data storage circuit 2021, may be specified by the second test mode signal TM2. The time when an error occurs in the data DT output by the memory cells MC that have been specified by the second test mode signal TM2 may be designated as a test target error pattern on which a target error correction operation needs to be executed. The sensing signal synthesis circuit 305 may generate the target error flag TE_FLAG when one of the detection signal DET and the test detection signal DET occurs.

Figure 5:
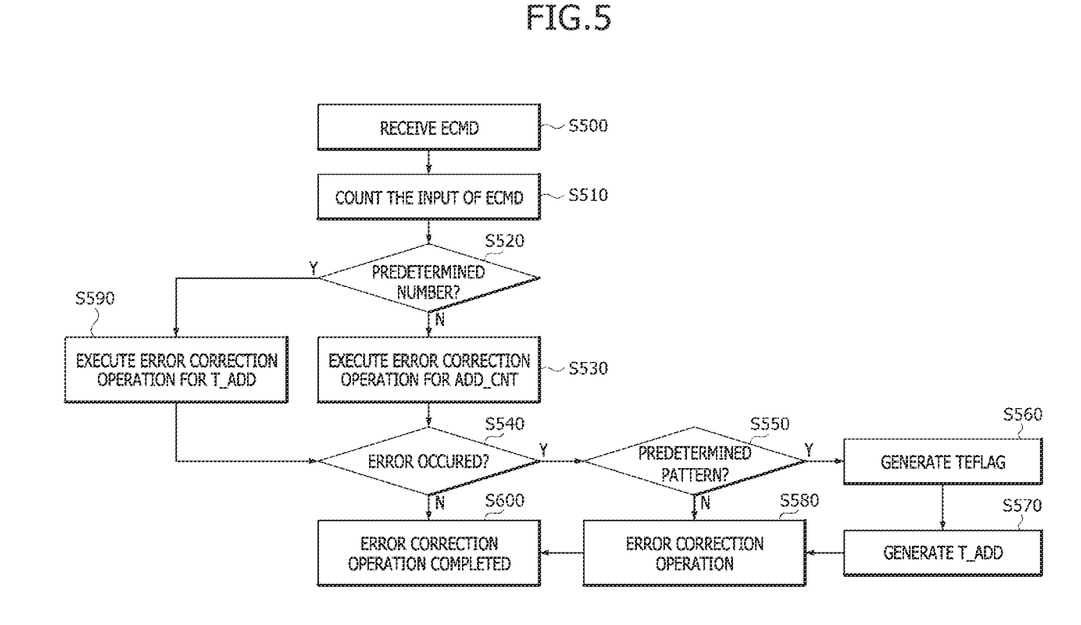
FIG. 5 is a flowchart illustrating an operating method of the semiconductor memory device according to an embodiment of the present disclosure.

FIG. 5 is a flowchart illustrating an operating method of the semiconductor memory device 200 according to an embodiment of the present disclosure. The semiconductor memory device 200 may generate the error correction command ECMD in response to the external control signal CA that is received from the memory controller 100 (S500). The semiconductor memory device 200 may count the error correction command ECMD (S510). The semiconductor memory device 200 may determine whether the number of counted error correction commands ECMD reaches a predetermined number (S520).

If the number of error correction commands ECMD has not reached the predetermined number, the semiconductor memory device 200 may execute an error correction operation based on the counting address ADD_CNT (S530). The semiconductor memory device 200 may check whether an error has occurred while executing the error correction operation (S540), and may complete the error correction operation if an error has not occurred (S600). If an error has occurred while the error correction operation is executed, the semiconductor memory device 200 may identify whether the error occurred corresponds to a predetermined pattern (e.g., a target error pattern or a test target error pattern) (S550). If the occurred error does not correspond to the predetermined pattern, the semiconductor memory device 200 may correct the error (S580) and then complete the error correction operation (S600). However, if the error occurred corresponds to the predetermined pattern, the semiconductor memory device 200 may generate the target error flag TE_FLAG (S560), may generate the target address T_ADD (S570), may correct the error (S580), and may complete the error correction operation (S600). When the number of error correction commands ECMD reaches the predetermined number in step S520, the semiconductor memory device 200 may execute a target error correction operation based on the target address T_ADD (S590). Subsequent operations are the same as the operations after the error correction operation is performed, and descriptions thereof are omitted.

Figure 6:
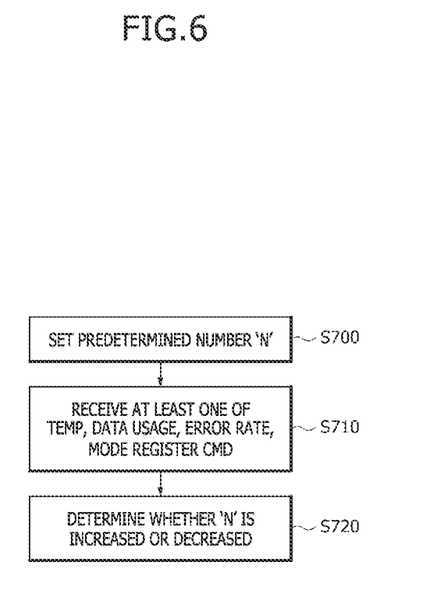
FIG. 6 is a flowchart for describing an operation of adjusting the number of target error correction operations in the semiconductor memory device according to an embodiment of the present disclosure.

FIG. 6 is a flowchart for describing an operation of adjusting the number of target error correction operations performed in the semiconductor memory device 200 according to an embodiment of the present disclosure. As illustrated in FIG. 6, the semiconductor memory device 200 may set a target error correction operation to be executed when an error correction operation is executed by a predetermined number of times "N" (S700). The initial setting of the value "N" may be determined through tests by a manufacturer, or may be determined through discussion with a customer. Furthermore, the initial setting of the value "N" may be determined based on a degree to which reliability is required. When the value "N" is small, the ratio of a target error correction operation to the target address T_ADD may be increased. When the value "N" is great, the ratio of a target error correction operation to the target address T_ADD may be reduced. The semiconductor memory device 200 may check temperature data (TEMP), data usage (DATA USAGE), an error rate (ERROR RATE), and a set signal that is stored in a mode register (MODE REGISTER CMD) (S710). In some embodiments, the semiconductor memory device 200 may receive the temperature data (TEMP), the data usage (DATA USAGE), the error rate (ERROR RATE), the set signal that is stored in the mode register (MODE REGISTER CMD) from the memory controller 100. The semiconductor memory device 200 may increase or decrease the value "N" by considering the temperature data (TEMP), the data usage (DATA USAGE), the error rate (ERROR RATE), etc. (S720). The semiconductor memory device 200 may directly receive, from the memory controller 100, information with regard to the setting of the value "N". The information with regard to the setting of the value "N" may be transmitted through a mode register command. The semiconductor memory device 200 may increase or decrease the value "N" based on the information with regard to the setting of the value "N" (S720).

Various embodiments of the present disclosure have been described. A person having ordinary knowledge in the art to which the present invention pertains will understand that the present invention may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure.

While the present invention has been described with respect to specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A semiconductor memory device comprising:
   a command address control circuit configured to generate, in response to an external control signal, an error correction command and a selection address for executing an error correction operation;
   an error flag generation circuit configured to execute the error correction operation by correcting an error of data corresponding to the selection address and configured to generate a target error flag based on a predetermined pattern of the error that occurred previously in the error correction operation and which is indicative of a problem in an operation of the semiconductor memory device; and
   an error information processing circuit configured to generate, based on the target error flag, a target address that is used as the selection address for a target error correction operation that is executed when the error correction operation is executed a predetermined number of times.

2. The semiconductor memory device of claim 1, wherein the target error correction operation is set to be repeatedly executed whenever the error correction operation is executed the predetermined number of times.

3. The semiconductor memory device of claim 2, wherein:
   the command address control circuit comprises a command control circuit configured to generate one of a selection error correction command and a target selection command in response to the error correction command, and
   the command control circuit is configured to generate the selection error correction command by the predetermined number in response to the error correction command and then generate the target selection command in response to the error correction command.

4. The semiconductor memory device of claim 3, wherein:
   the command address control circuit is further configured to adjust the predetermined number based on a first test mode signal, and the first test mode signal is generated based on at least one of an internal temperature, data usage, an error occurrence ratio, or a set signal that is stored in a mode register included in the semiconductor memory device.

5. The semiconductor memory device of claim 3, wherein the command address control circuit further includes an address counter configured to generate a counting address by counting the selection error correction command.

6. The semiconductor memory device of claim 5, wherein the command address control circuit further includes an address selection circuit configured to output one of the counting address and the target address as the selection address in response to the target selection command.

7. The semiconductor memory device of claim 1, wherein the error flag generation circuit comprises:
a data storage circuit configured to store the data, and
a parity storage circuit configured to store a parity that is generated based on the data.

8. The semiconductor memory device of claim 7, wherein the error flag generation circuit includes:
an error correction circuit configured to generate a syndrome from the data corresponding to the selection address and the parity and configured to generate an error flag by determining the error based on the syndrome; and
a target error detection circuit configured to generate the target error flag by determining the pattern of the error based on the syndrome.

9. The semiconductor memory device of claim 8, wherein:
the error correction circuit generates the error flag when the error occurs, and
the target error detection circuit generates the target error flag when the error has the predetermined pattern.

10. The semiconductor memory device of claim 9, wherein the predetermined pattern is the error occurred from memory cells of the data storage circuit and the memory cells is located adjacent to the parity storage circuit.

11. The semiconductor memory device of claim 1, wherein the error information processing circuit includes a flag detection circuit configured to generate an error detection signal and a target error detection signal based on an error flag and the target error flag and configured to generate an error pulse when the error flag is generated.

12. The semiconductor memory device of claim 11, wherein the error information processing circuit further includes an error counter configured to generate an error counting signal by counting the error pulse.

13. The semiconductor memory device of claim 12, wherein the error information processing circuit further includes an error information storage circuit configured to store the selection address and the error counting signal as error information in response to the error detection signal and the target error detection signal.

14. The semiconductor memory device of claim 13, wherein the error information processing circuit further includes an error information input and output (I/O) control circuit configured to generate the target address based on selection error information that is included in the error information stored in the error information storage circuit and that is selected by an information selection signal.

15. The semiconductor memory device of claim 14, wherein the error information I/O control circuit is further configured to receive information with regard to the target address through a data pad in response to a third test mode signal.

16. The semiconductor memory device of claim 14, wherein the error information I/O control circuit is further configured to sequentially output, as the target address, the error information that has been stored in the error information storage circuit.

17. The semiconductor memory device of claim 14, wherein the error information I/O control circuit is further configured to output the selection error information through the data pad in response to a mode register read command.

18. A memory system comprising:
a semiconductor memory device; and
a memory controller configured to control the semiconductor memory device,
wherein the semiconductor memory device is configured to:
generate a selection address so that an error correction operation for a counting address or a target error correction operation for a target address is selectively executed in response to a control signal that is provided by the memory controller, and
generate the target address when an error corrected through the error correction operation is a target error having a predetermined pattern that occurred previously in the error correction operation and which is indicative of a problem in an operation of the semiconductor memory device.

19. The memory system of claim 18, wherein:
the semiconductor memory device comprises a command control circuit configured to generate one of a selection error correction command and a target command in response to an error correction command, and
the command control circuit is configured to generate the selection error correction command by a predetermined number in response to the error correction command and then generate a target selection command in response to the error correction command.

20. The memory system of claim 18, wherein the semiconductor memory device is further configured to determine whether the error corrected through the error correction operation is the target error having the predetermined pattern, based on a syndrome that is generated based on data and a parity that correspond to the selection address.

21. The memory system of claim 20, wherein the target error is the error corrected through the error correction operation is included in the data and occurred from memory cells adjacent to a parity storage circuit included in the semiconductor memory device.

22. The memory system of claim 18, wherein the semiconductor memory device is further configured to:
adjust the predetermined number in response to a first signal that is provided by the memory controller,
receive, from the memory controller, information for generating the target address in response to a second signal, and
provide the memory controller with information that is related to the target address, in response to a third signal.

23. A method of executing an error correction operation, comprising:
transmitting a control signal from a memory controller to a semiconductor memory device in order to execute an error correction operation;
selecting, as a target address, an address in which a corrected error has occurred when the error, which is corrected through the error correction operation executed by the semiconductor memory device, has a predetermined pattern that occurred previously in the error correction operation and which is indicative of a problem in an operation of the semiconductor memory device; and executing a target error correction operation on the target address after the error correction operation is executed for a predetermined number of times.

24. The method of claim 23, wherein the error correction operation comprises:

correcting the error based on a syndrome that is generated based on data and a parity; and determining whether the error has the predetermined pattern based on the syndrome.

25. The method of claim 23, further comprising transmitting the target address to the memory controller through a data pad.

26. The method of claim 23, wherein the predetermined pattern is the error is occurred from memory cells adjacent to a parity storage circuit included in the semiconductor memory device.

27. An operating method of a memory device, the operating method comprising:

performing a first error correcting operation on a region of memory cells included therein, the error correcting operation including collecting information of a predetermined location, wherein the information is indicative of a problem in an operation of the semiconductor memory device, from which an error is detected within the region; and performing, after completing a predetermined number of times of the first error correcting operation to identify the predetermined location in the region of memory cells, a second error correcting operation on the predetermined location based on the collected information to improve reliability of data stored in the predetermined location.

* * * * *